United States Patent
Ma et al.

(10) Patent No.: US 7,699,636 B2
(45) Date of Patent: Apr. 20, 2010

(54) ELECTRICAL CONNECTOR

(75) Inventors: Hao-Yun Ma, Tu-Cheng (TW); Darrell Wertz, Chandler, AZ (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/728,392

(22) Filed: Mar. 26, 2007

(65) Prior Publication Data

US 2008/0242122 A1    Oct. 2, 2008

(51) Int. Cl.
    *H01R 13/62* (2006.01)
(52) U.S. Cl. .................................... 439/331
(58) Field of Classification Search ............... 439/331, 439/330, 71, 342
    See application file for complete search history.

(56) References Cited

U.S. PATENT DOCUMENTS

| | | | | |
|---|---|---|---|---|
| 4,692,790 A | * | 9/1987 | Oyamada ................. | 257/727 |
| 5,167,515 A | * | 12/1992 | Matsuoka et al. ........ | 439/108 |
| 6,685,494 B1 | * | 2/2004 | McHugh et al. .......... | 439/342 |
| 6,776,625 B2 | * | 8/2004 | Ma ........................... | 439/73 |
| 7,025,603 B2 | * | 4/2006 | Ma ........................... | 439/73 |
| 7,097,464 B1 | * | 8/2006 | McHugh et al. .......... | 439/73 |
| 7,402,065 B1 | * | 7/2008 | Polnyi ..................... | 439/331 |
| 2004/0259407 A1 | * | 12/2004 | Chiang .................... | 439/331 |
| 2005/0106923 A1 | * | 5/2005 | Ma ........................... | 439/331 |
| 2005/0287858 A1 | * | 12/2005 | Toda et al. ............... | 439/331 |
| 2006/0121765 A1 | * | 6/2006 | Ma ........................... | 439/331 |
| 2008/0057751 A1 | * | 3/2008 | Zhang ...................... | 439/73 |
| 2008/0113545 A1 | * | 5/2008 | Zhang et al. ............. | 439/345 |

* cited by examiner

*Primary Examiner*—T C Patel
*Assistant Examiner*—Vladimir Imas
(74) *Attorney, Agent, or Firm*—Andrew C. Cheng; Wei Te Chung; Ming Chieh Chang

(57) ABSTRACT

An electrical connector (1) comprises an insulative housing (2), a plurality terminals received in the housing (2), a stiffener (3) engaged with the housing (2), a clip (5) and a lever (4) pivotably mounted on two opposite sides of the stiffener (3). The lever (4) comprises a pair of locating portions (424) pivotably received in the stiffener (3), an offset actuating portion (422) between the locating portions (424), and an operating portion (43) extending upward and frontward from an end of the locating portions (424) and bent far away from the housing (2).

16 Claims, 5 Drawing Sheets

ELECTRICAL CONNECTOR

BACKGROUND OF THE INVENTION

1. Field of the Invention

The present invention relates to the art of electrical connectors, and more particularly to an electrical connector provided for mechanically and electrically connecting a chip module to a printed circuit board (PCB).

2. Description of the Prior Art

Electrical connectors are widely used in the connector industry for electrically connecting a chip module to a printed circuit board (PCB) in personal computer. Conventionally, an electrical connector mainly comprises an insulative housing, a multiplicity of terminals received therein, a load plate and a lever pivotably mounted on two opposite sides of the housing.

Referring to FIG. 5, a conventional electrical connector 10' comprises an insulative housing 20', a plurality of terminals received in corresponding passageways of the housing 20', a metal stiffener 30' partly covering and reinforcing the housing 20', a metal clip 50 pivotably attached to an end of the stiffener 30', and a lever 60' pivotably mounted to an opposite end of the stiffener 30' for engaging with the lever 60'.

The housing 20' defines a multiplicity of passageways in a rectangular array, for interferentially receiving corresponding terminals.

The stiffener 30' is substantially rectangular and comprises a pair of lateral sides 36' each having a substantially L-shaped cross-section, a left end 32' having an U-shaped cross-section, and a right end 34' having an L-shaped cross-section. The housing 20' is fittingly received in the stiffener 30'. The U-shaped cross-section comprises a pair of stopper 322' extending therefrom and an anchoring portion 324' disposed on one stopper 322' for locating the locating portion 624' of the lever 60'.

The lever 60' comprises a pair of locating portions 624' pivotably received in the chamber 322' of the stiffener 30', an offset actuating portion 622' between the locating portions 624', and an operating portion 63' extending perpendicularly from an end of one of the locating portions 624' and bent towards the offset actuating portion 622'. The operating portion 63' is disposed outside of the stiffener 30'.

When the electrical connector 10' is assembled, the lever is engaged with the anchoring pad of the stiffener 30. The operating portion is used to drive the cover engaging/disengaging with the housing, however the operating portion in the art is disposed too close to the connecting portion 61' of the lever, which decreases the space for users operating the lever to open/close the cover. In addition, the lever of the art uses too much material and needs a complicate manufacturing process.

Thus, there is a need to provide an electrical connector that overcomes the above-mentioned problems.

SUMMARY OF THE INVENTION

Accordingly, an object of the present invention is to provide an electrical connector able to ensure a stable and reliable mechanical and electrical connection between the chip module and the printed circuit board.

To fulfill the above-mentioned object, an electrical connector in accordance with the preferred embodiment comprises an insulative housing, a plurality terminals received in the housing, a stiffener engaged with the housing, a clip and a lever pivotably mounted on two opposite sides of the stiffener and a securing member engaging with the locating portion of the lever. The lever comprises a pair of locating portions pivotably received in the stiffener, an offset actuating portion between the locating portions, and an operating portion extending upward and frontward from an end of the locating portions and bent far away from the housing.

Relative to the present technology, the electrical connector in accordance with the prefer embodiment of the invention defines a lever comprising an operating portion extending upward and frontward from an end of the locating portions and bent far away from the housing, which increases the space for users operating the lever to open or close the cover, and decreases the material and process for manufacturing the lever.

Other objects, advantages and novel features of the present invention will become more apparent from the following destoppered description when taken in conjunction with the accompanying drawings, in which:

DESCRIPTION OF PREFERRED EMBODIMENT OF THE INVENTION

Reference will now be made to the drawings to describe the present invention in destopper.

Figure 1:
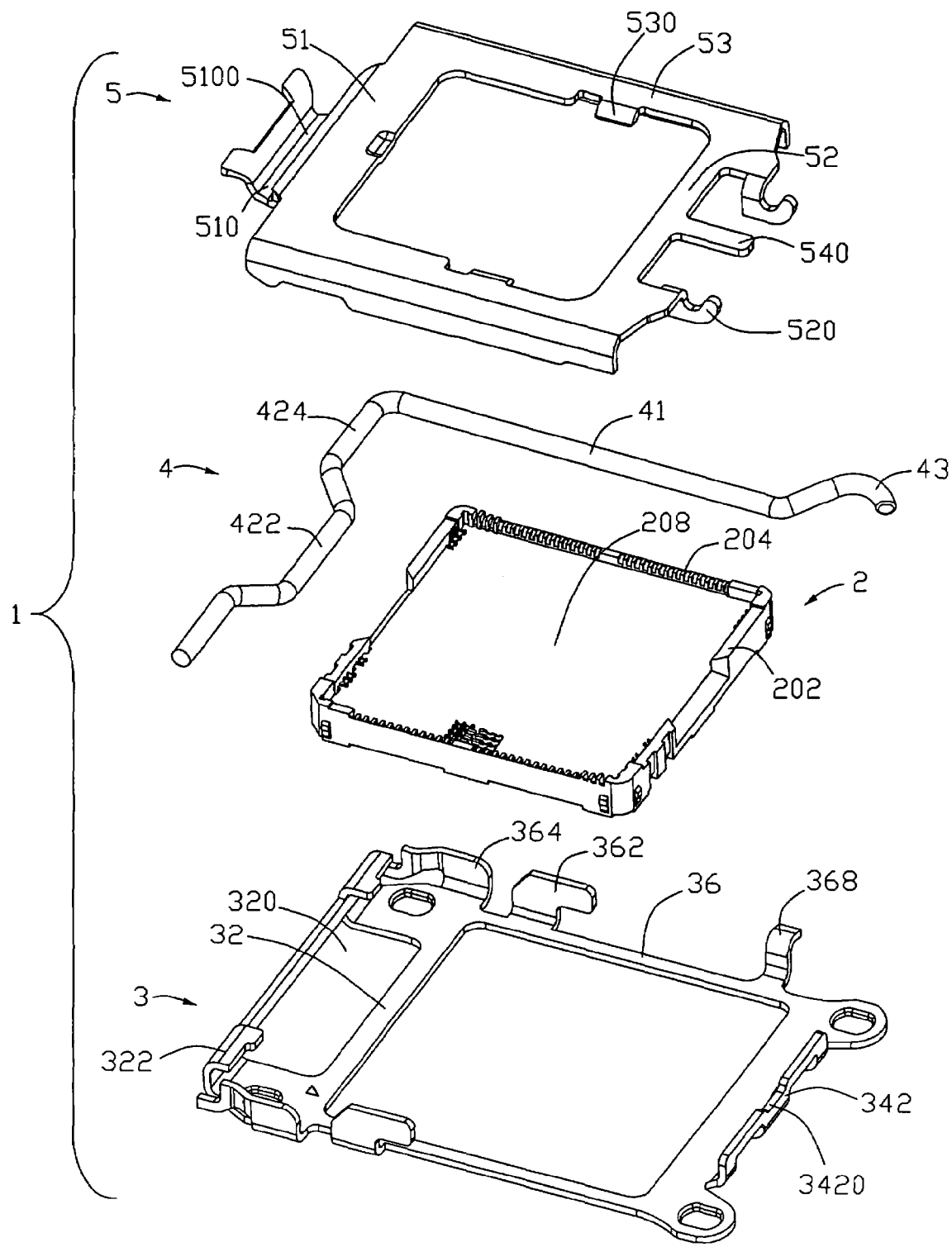
FIG. 1 is an exploded, isometric view of an electrical connector in accordance with a preferred embodiment of the present invention.

FIG. 1 is an exploded, isometric view of an electrical connector 1 in accordance with a preferred embodiment of the present invention. The electrical connector 1 provided for electrically connecting a chip module (not shown) to a circuit substrate (not shown) includes an a generally rectangular insulative housing 2, a multiplicity of terminals received in the housing 2, a metal stiffener 3 partly covering and reinforcing the housing 2, a lever 4 pivotably attached to an end of the stiffener 3, a metal clip 5 pivotably mounted to an opposite end of the stiffener 3 for engaging with the lever 4.

Figure 2:
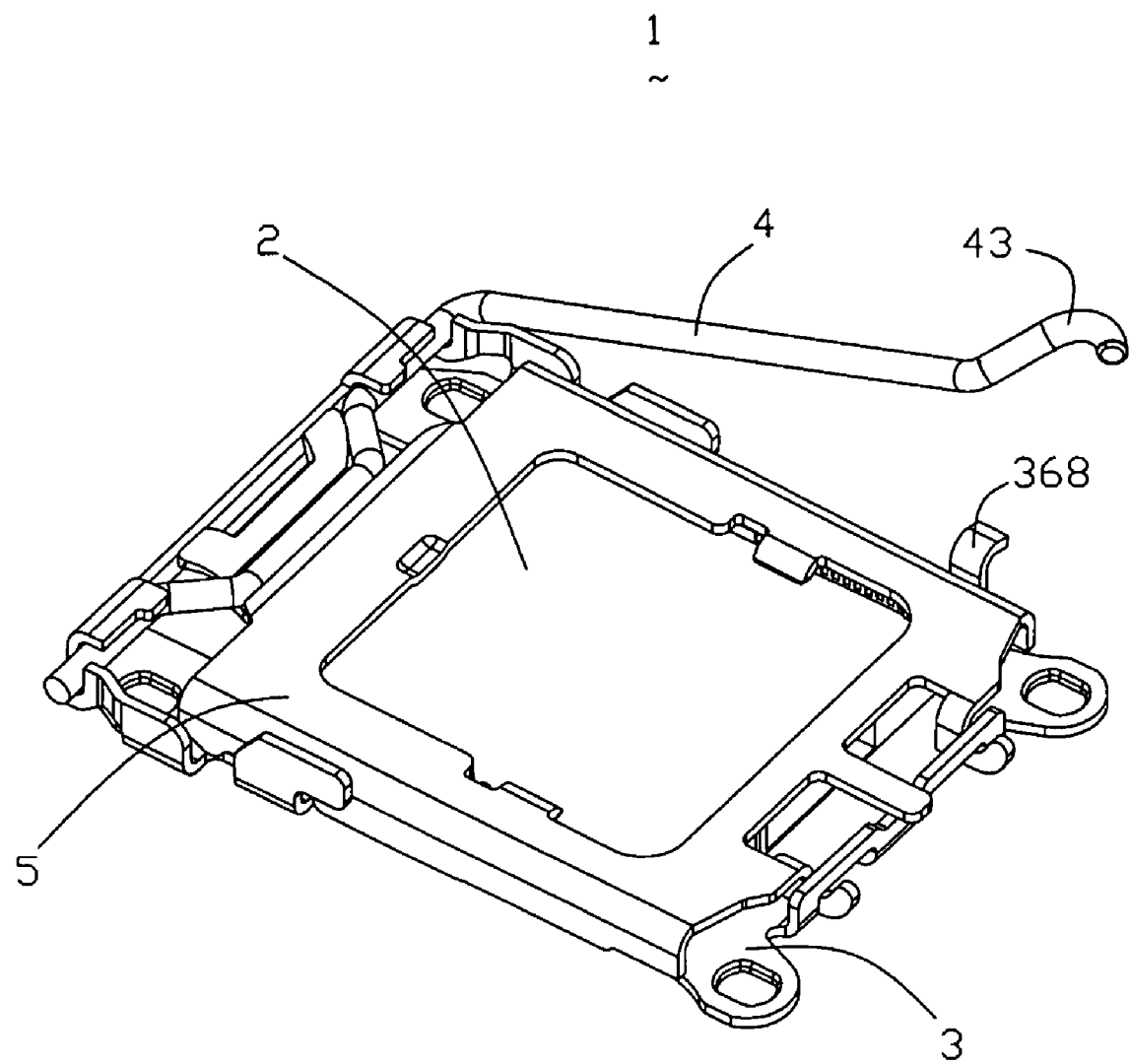
FIG. 2 is an assembled, isometric view of the electrical connector shown in FIG. 1, wherein the lever is open.

Referring to FIG. 1-2, the housing 2 includes a pair of first sidewalls 202 opposite to each other and two opposite, a pair of second sidewalls 204 connecting with the first sidewalls 202 respectively. The four sidewalls cooperatively define a generally rectangular cavity 208 in a middle section thereof for receiving the chip module therein. A multiplicity of passages is defined in a portion of the housing 2 under the cavity 208, for receiving a corresponding number of the terminals 21 therein respectively.

Referring to FIG. 2, the stiffener 3 is substantially rectangular and comprises a pair of lateral sides 36 each having a pair of substantially L-shaped sections 362 and for engaging with sidewalls 53 of the clip 5 a pair stopper wall 364 adjacent to the L-shaped sections 362, a left end 32 having a pair of U-shaped cross-section 322 and a receiving recess 320 for receiving the engaging portion 510 of the clip 5 therein, and a right end 34 having a supporting section 342 upwardly extending from a right side of the stiffener 3 for supporting the stopper 540 of the clip 5 thereon, wherein one of the lateral side 36 defines a locking hook 368 for engaging with lever 4.

Referring to FIG. 2, the lever 4 includes a connecting portion 41, a pair of locating portions 424 pivotably received in the chambers 322 of the stiffener 20, an offset actuating portion 422 between the locating portions 322, and an operating portion 43 extending upward and frontward from an end of the locating portions 424 and bent far away from the housing 2. The operating portion 43 is disposed outside of the stiffener 3. When oriented at a horizontal position parallel to the housing 2, the operating portion 43 engages with the locking hook 38 on the stiffener 3.

Referring to FIG. 2, the clip 5 has a first side 51, a second side 52 opposite to the first side 51 and two opposite third slant sides 53 adjacent the first and second sides 51, 52 respectively. The first side 51, the second side 52 and third sides 53 cooperatively form a hollow receiving space. The third sides 53 are bent toward the housing 2 and each of the third sides 53 defines a pressing portion 530 extending from inner side thereof and bent toward the housing 2 in a middle portion thereof. An engaging portion 510 is extended arcuately from an outside of the first side 51 thereof defining a receiving portion for receiving the offset actuating portion 422 of the lever therein. A pair of spaced securing portions 520 is extended arcuately from the second side 52 thereof and pivotably received in the slots 324 of the stiffener 30, and a stopper 540 formed between the securing portions 520. When the clip 5 is oriented at a horizontal position parallel to the housing 2, the engaging portion 510 of the clip 5 engages with the actuating portion 422 of the lever 4, thereby the driving actuating portion 422 to press the chip module on the terminals 21. When the clip 5 is oriented at a vertical position perpendicular to the housing 2, the stopper 540 abuts against the stiffener 3 to prevent the clip 5 from being over-rotated.

Figure 3:
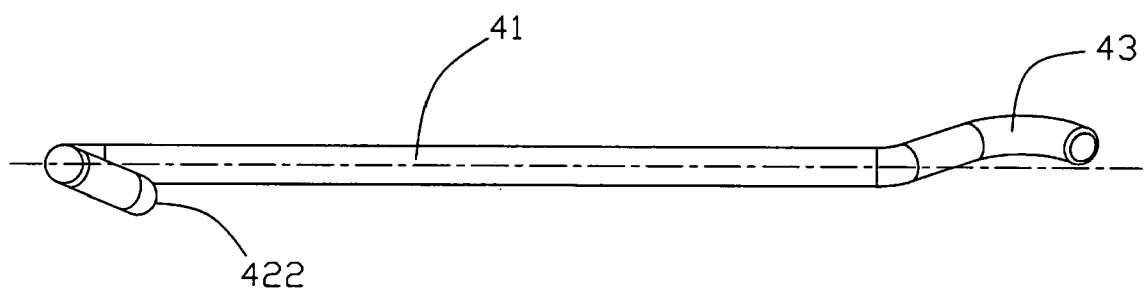
FIG. 3 is an isometric view of the lever of the electrical connector shown in FIG. 1.
Figure 4:
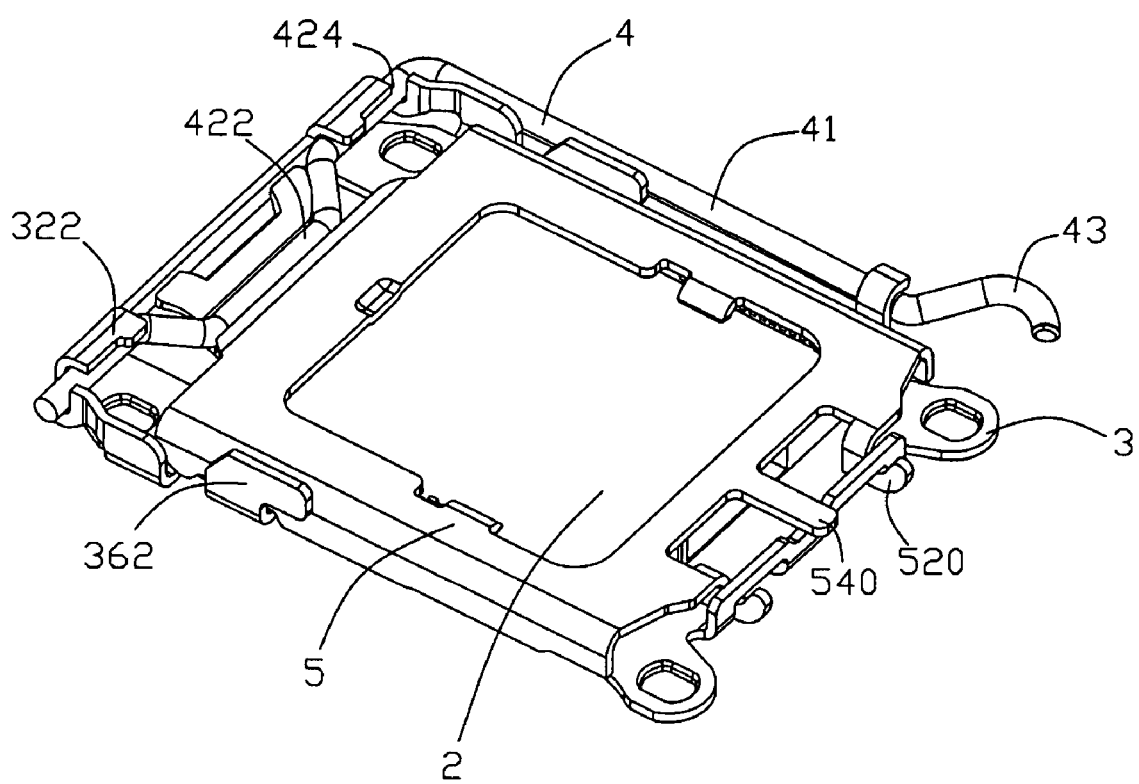
FIG. 4 is an assembled view of the electrical connector shown in FIG. 1.
Figure 5:
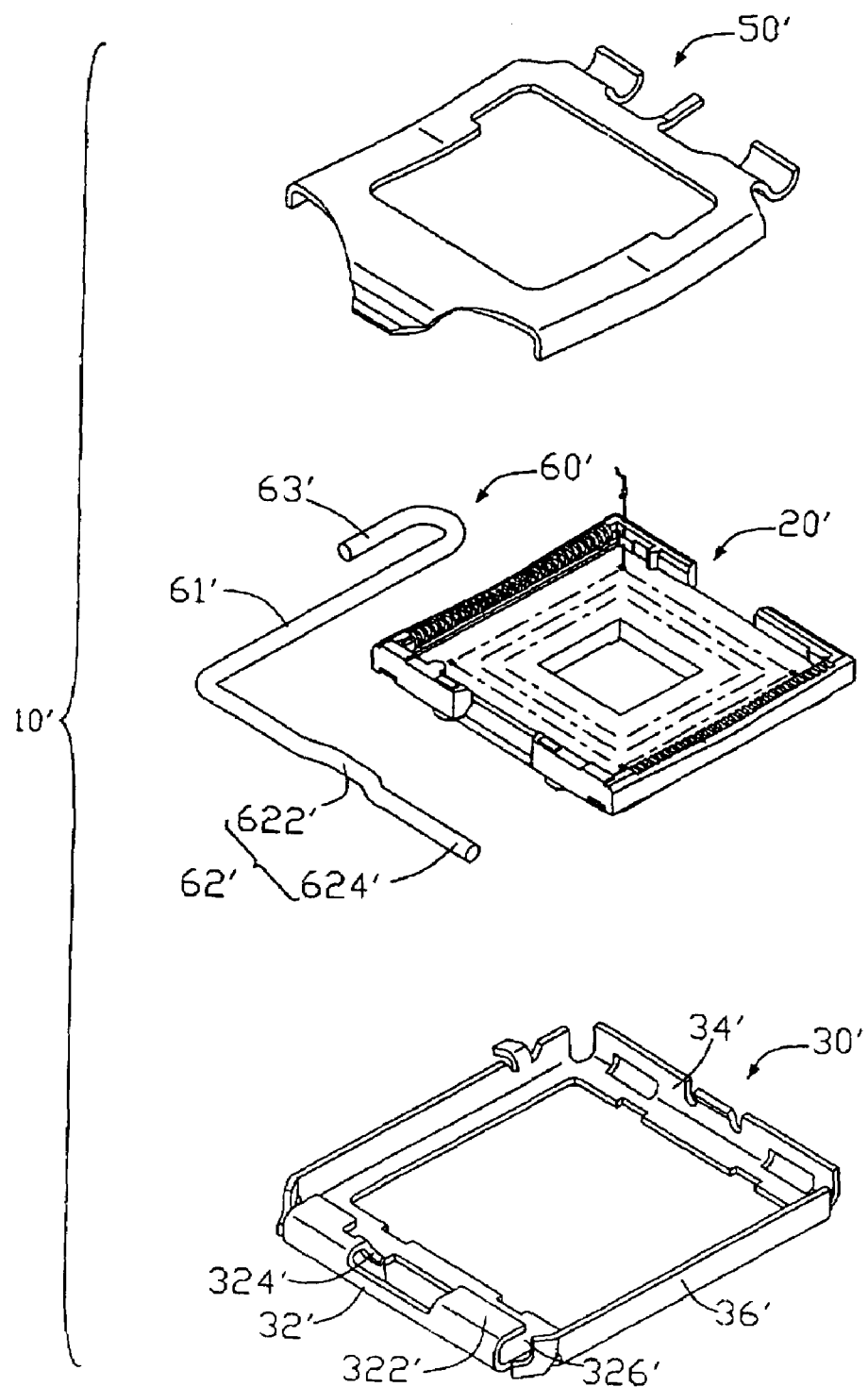
FIG. 5 is an exploded, isometric view of a conventional electrical connector.

Referring to FIGS. 1-4, since the operating portion 43 is bent outwardly from the end of the connecting portion 41 along a direction away from the insulative housing 2, the stiffener 3 and the metal clip 5 and upwardly gradually, then curved inwardly toward the insulative housing 2 and downwardly gradually. The free end of the operating portion 43 does not extend beyond the outermost contour of the stiffener 3. Therefore, the upwardly curved then downwardly curved operating portion 43 provides the same user-friendliness, but has less material and thus is cheaper. Further, as shown in FIG. 3, if we define a central axis of the connecting portion 41 along its extending direction, the operating portion 43 is wholly located above the central axis of the connecting portion 41 with its free end substantially contact the central axis. In addition, the furthest section of the operating portion 43 relative to the central axis is substantially aligned with an axis defined by a pair of mounting holes of the stiffener 3. The first side 51 is located in a front end of the clip 5, while the second side 52 is located in a rear end of the clip 5. The free end of the operating portion 43 is located in front of the whole connection portion 41 along a front-to-back direction.

Although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. An electrical connector adapted for electrically connecting an electronic package with a circuit substrate, the electrical connector comprising:
   a housing with reinforce adapted for being arranged mounted on the circuit substrate;
   a stiffener located beside the housing adapted for being fastened to the circuit substrate and comprising a front and a rear ends;
   a clip pivotally mounted to the front end of the metal stiffener; and
   a load lever attached to the rear end of the stiffener, the load lever comprising a connecting portion extending between said front and the rear ends of the stiffener, an actuating portion extending from an end of the connecting portion and being pivotally mounted to said the rear end of the stiffener to secure the clip and an operating portion forwardly extending toward said front end of the stiffener from the other end of the connecting portion and outwardly to be far away from the actuating portion and the housing or the stiffener at the same time, the operating portion having a free end in front of the whole connecting portion along a front-to-back direction, a portion of the free end first extends away from the longitudinal axis of connecting portion and then bends toward the axis of the connecting portion.

2. The electrical connector as claimed in claim 1, wherein the operating portion comprises a bending portion bending slantways and upwardly from the other end of the connecting portion, a handle extending from a distal end of the bending portion.

3. The electrical connector as claimed in claim 2, wherein the load lever comprises a pair of locating portions with said actuating portion between the locating portions extending from said end of the connecting portion.

4. The electrical connector as claimed in claim 1, wherein the clip is configured in a rectangular shape with a window in a center portion thereof and defines a pressing portion extending bendly and downwardly from each inner side in a substantially center portion thereof.

5. The electrical connector as claimed in claim 4, wherein the clip further defines an engaging portion extending arcuately from a left side thereof having a receiving portion for receiving the offset actuating portion of the lever therein.

6. The electrical connector as claimed in claim 1, wherein the stiffener defines a locking hook on one of the lateral side for engaging with the lever.

7. The electrical connector as claimed in claim 1, wherein the operating portion of the lever is of arcuate shape and firstly extends away from the housing and forwardly and upwardly gradually and then extends toward the housing and forwardly and downwardly gradually.

8. The electrical connector as claimed in claim 7, wherein the free end of the arcuate operating portion of the lever is located adjacent to said one end of the stiffener but does not extend beyond outmost contour of said one end of the stiffener.

9. An electrical connector adapted for electrically connecting an electronic package with a circuit substrate, comprising:
   an insulative housing adapted for interferentially mounted to the circuit substrate;
   a stiffener arranged beside said insulative housing adapted for being fastened to said circuit substrate and comprising opposite ends along a lengthwise direction;

a clip pivotally mounted to one end of said opposite ends of the metal stiffener and comprising a distal end adjacent to the other end of said opposite ends of the metal stiffener;

a load lever pivotally attached to said the other end of the stiffener and comprising a connecting portion extending between said opposite ends of the stiffener, and an actuating portion extending from a first end of the connecting portion and pivotally mounted to said the other end of the stiffener and an operating portion extending outwardly from an opposed second end of the connecting portion; and wherein the operating portion firstly extends away from the central axis of the connecting portion then toward the central axis of the connecting portion, and the operating portion is outside the connecting portion without overlap with the connecting portion in said lengthwise direction, so a distance of a free end of the operating portion to the first end of the connecting portion in the lengthwise direction is longer than another distance of the second end to the first end of the connecting portion.

10. The electrical connector as claimed in claim 9, wherein the connecting portion of the lever defines a horizontal central axis along extending direction thereof, and wherein the operating portion of the lever is located above the central axis.

11. The electrical connector as claimed in claim 10, wherein the actuating portion of the lever is located below the central axis of the connecting portion.

12. The electrical connector as claimed in claim 10, wherein the operating portion of the lever firstly extends away from the central axis then extends toward the central axis of the operating portion.

13. The electrical connector as claimed in claim 12, wherein the free end of the operating portion is located adjacent to the central axis of the connecting portion and does not extend beyond said central axis.

14. The electrical connector as claimed in claim 9, wherein the operating portion is of arcuate shape and firstly upwardly and outwardly extends from the connecting portion, and then downwardly and inwardly extends toward the connecting portion.

15. A land grid array socket, comprising:

a stiffener defining an opening in a central portion thereof and having front and rear ends, the stiffener having an locking hook close to the front end along a first side of the stiffener;

a housing being disposed within the opening and having a plurality of contacts disposed therein, the housing having a top surface for receiving a land grid array package;

a clip pivotally mounted on the front end of the stiffener, the clip being pivotal between an open position and a closed position where the clip presses the land grid array package toward the top surface of the housing so that land grid array package electrically connects to the contacts; and a lever pivotally mounted on the rear end of the stiffener, the lever including an operating arm extending along the first side of the stiffener and having a locking portion for locking the clip in the closed position when the operating arm is releasably retained by the locking hook;

wherein the operating arm includes a curved thumb rest portion at a point forwardly beyond the locking hook, and defines a thumb clearance located between the first end, the locking hook and the thumb rest portion, the thumb portion first extends away from the central axis of the connecting portion and then toward the central axis of the connecting portion.

16. The land grid array socket as claimed in claim 15, wherein said curved thumb rest extends forwardly from said point essentially higher than a main portion of the operating arm in a side view, forming not only an upward convex in said side view but also an outward convex in a top view so as to provide said thumb clearance with a converging end for assuring thumb operation without slipping.

\* \* \* \* \*